United States Patent [19]

Kushiyama

[11] Patent Number: 4,929,945
[45] Date of Patent: May 29, 1990

[54] SEMICONDUCTOR MEMORY DEVICE HAVING A SMALL NUMBER OF SIGNAL LINES

[75] Inventor: Natsuki Kushiyama, Yokosuka, Japan

[73] Assignee: Kabushiki Kaisha Toshiba, Kawasaki, Japan

[21] Appl. No.: 171,104

[22] Filed: Mar. 21, 1988

[30] Foreign Application Priority Data

Mar. 31, 1987 [JP] Japan .................................. 62-78610

[51] Int. Cl.⁵ ............................................ H03M 1/00
[52] U.S. Cl. ...................................... 341/50; 341/110; 341/155
[58] Field of Search ................. 341/50, 110, 133, 136, 341/144, 153, 155

[56] References Cited

U.S. PATENT DOCUMENTS

| | | | |
|---|---|---|---|
| 3,666,890 | 5/1972 | Wade | 341/110 |
| 3,755,807 | 8/1973 | Brown | 341/136 |
| 3,984,830 | 10/1976 | Buchanan et al. | 341/136 |
| 4,051,469 | 9/1977 | Ninomiya | 341/110 |
| 4,176,344 | 11/1979 | Saari et al. | 341/133 |
| 4,331,892 | 5/1982 | Miskin et al. | 341/153 |
| 4,345,241 | 8/1982 | Takeuchi et al. | 341/155 |
| 4,761,634 | 8/1988 | Yamaguchi et al. | 341/155 |

*Primary Examiner*—William M. Shoop, Jr.
*Assistant Examiner*—Marc S. Hoff
*Attorney, Agent, or Firm*—Finnegan, Henderson, Farabow, Garrett and Dunner

[57] ABSTRACT

A digital signal is converted to an analog signal by an analog voltage generator. The analog signal is transferred via at least one analog signal line, to a digital voltage generator in which the analog signal transferred via the analog signal line is converted into a digital signal. In this way, the digital signal is converted to an analog signal at the input section of the semiconductor device, the converted analog signal is transferred to the digital signal generator through an analog signal line, and is converted back to a digital signal. Therefore, the number of wirings of the signal lines can be decreased, and hence the wiring occupying area on the semiconductor chip can be reduced.

10 Claims, 7 Drawing Sheets

SEMICONDUCTOR MEMORY DEVICE HAVING A SMALL NUMBER OF SIGNAL LINES

BACKGROUND OF THE INVENTION

1. Field of the Invention

This invention relates to a semiconductor device, and, more particularly, to the reducing the area of a semiconductor chip that is occupied by wiring.

2. Description of the Related Art

In recent years, the amount of wiring used for signal lines, data lines, and so forth, has increased significantly as a result of the increase in capacity of and the multiple functions now performed by semiconductor devices.

Figure 1:
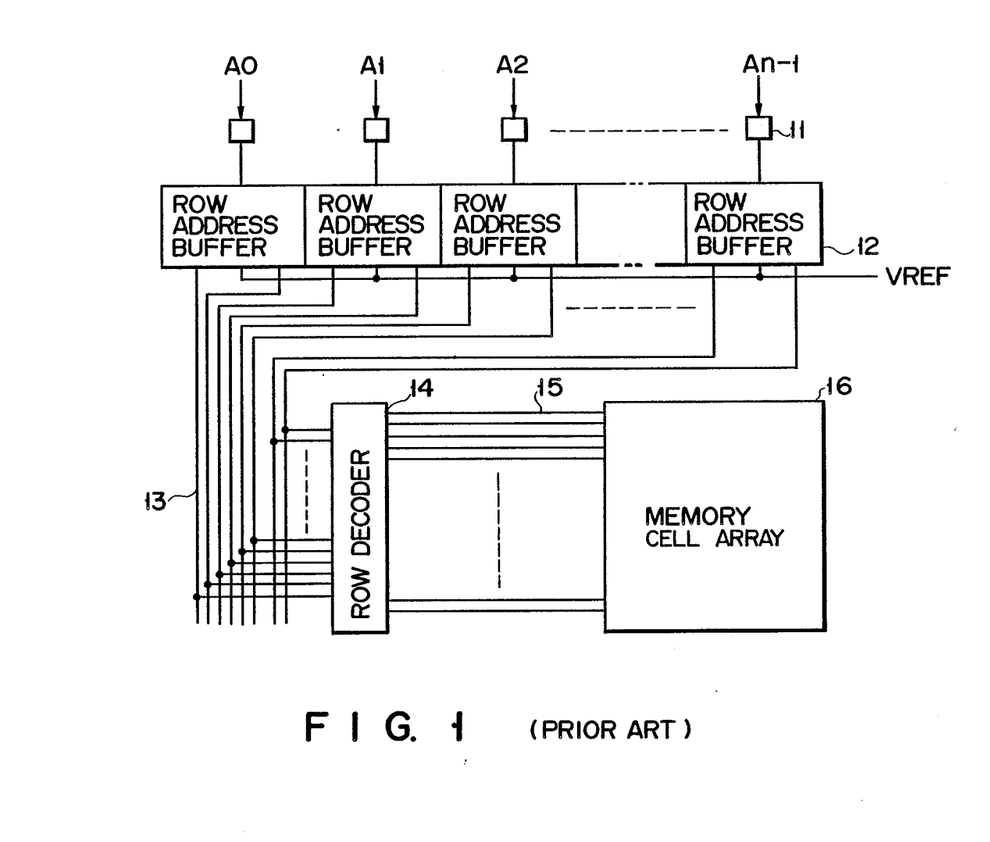
FIG. 1 shows a block diagram illustrating a row address designating section in a conventional dynamic random access memory (DRAM)

FIG. 1, for example, shows a block diagram of a row address designation section of a prior art dynamic random access memory (DRAM). Referring to FIG. 1, n row address signals A0 to An-1 (n: an integer) are respectively input to n address pads 11. N address pads 11 are respectively connected to n row address buffers 12. Address buffers 12 respectively receive the row address signals input to associated address pads 11, and each generate two complementary address signals, i.e., an address signal at the same logic level as that of the input row address signal, and an address signal opposite in level to that of the input row address signal. In other words, buffers 12 each generate two address signals, one at a positive logic level, and the other at a negative logic level. These address signals are input to row decoder 14 via row address signal lines 13. Row address decoder 14 decodes the address signals, and from among a plurality of word lines 15 of memory cell array 16 which are connected to the output terminals of row decoder 14, selects and energizes the one of these word lines which has been designated by the decoded address signal.

Figure 2:
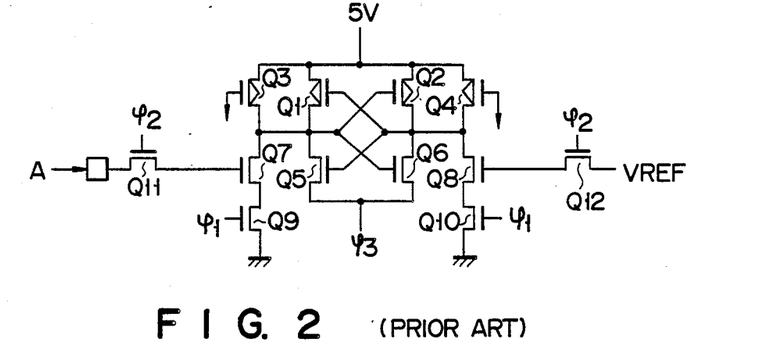
FIG. 2 is a circuit diagram of a detailed circuit of a row address buffer in a conventional DRAM.

FIG. 2 shows a circuit configuration illustrating a row address buffer of a typical conventional DRAM.

Figure 3:
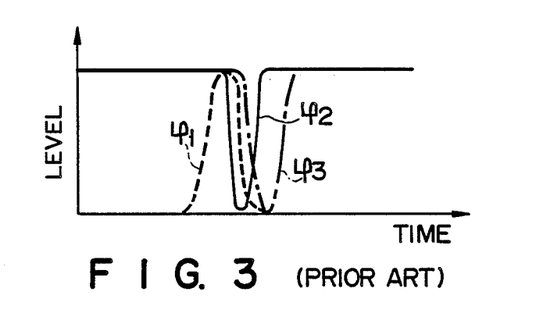
FIG. 3 shows waveforms of control signals input to the row address buffer of FIG. 2.

The row address buffer includes P channel enhancement type MOS (metal oxide semiconductor) transistors Q1 to Q4 and N channel enhancement type MOS transistors Q5 to Q12. The main portion of the row address buffer includes a flip-flop circuit, which is made up of P channel MOS transistors Q1 to Q4 and N channel transistors Q5 to Q10. The source of P channel MOS transistor Q1 is connected to a power potential of 5 V, and its drain is connected to the drain of N channel MOS transistor Q5. The source of N channel MOS transistor Q5 is supplied with clock pulse $\phi 3$ (FIG. 3) via a control signal line. The source of P channel MOS transistor Q2 is also connected to the power potential of 5 V, and its drain is connected to the drain of N channel MOS transistor Q6. The source of N channel MOS transistor Q6 is also supplied with clock pulse $\phi 3$. The connection point of the drains of P channel MOS transistor Q1 and N channel MOS transistor Q5 is itself connected to the gate of P channel MOS transistor Q2, and also to the gate of N channel MOS transistor Q6. Likewise, the connection point of the drains of P channel MOS transistor Q2 and N channel MOS transistor Q6 is connected to the gate of P channel MOS transistor Q1, and also to the gate of N channel MOS transistor Q5.

P channel MOS transistor Q3 and N channel MOS transistors Q7 and Q9 are connected in series between the power potential of 5 V and the ground potential. P channel MOS transistor Q4 and N channel MOS transistors Q8 and Q10 are similarly connected in series between these same potentials. The gate of N channel MOS transistor Q7 is connected to address pad 11 via N channel MOS transistor Q11, which acts as a transfer gate. The gate of N channel MOS transistor Q8 is supplied with reference potential VREF via N channel MOS transistor and Q12, which acts as a transfer gate. Clock pulse $\phi 1$ (FIG. 3) is supplied to the gates of N channel MOS transistors Q9 and Q10, and clock pulse $\phi 2$ (FIG. 3) is supplied to the gates of N channel MOS transistors Q11 and Q12, both of which act as transfer gates. The gates of P channel MOS transistors Q3 and Q4 are grounded.

Next, the operation of the row address buffer of FIG. 2 will be described.

The address buffer is operated under the control of clock pulses.

Assume that clock pulse $\phi 2$ is at a high level, and N channel MOS transistors 011 and Q12, acting as transfer gates, are in an on-state. Under these conditions, if clock pulse $\phi 1$ goes high in level and N channel MOS transistors Q9 and Q10 are turned on, the comparison of the potential of the address signal input via address pad 11 with reference potential VREF is started. Specifically, the comparison of the potential at the connection point of the drains of P channel MOS transistor Q1 and N channel MOS transistor Q5 with the potential at the connection point of the drains of P channel MOS transistor Q2 and N channel MOS transistor Q8, is started by the flip-flop. Subsequently, if clock pulse $\phi 2$ goes low, N channel MOS transistors Q11 and Q12 are turned off, and the row address buffer is disconnected from the external circuit. That is, the row address buffer is disconnected from the external address signal potential and reference potential VREF. If then, clock pulse $\phi 3$ goes low, it is decided which of the address signal potential and reference potential VREF is higher. If the address signal potential is higher than reference potential VREF, the address signal potential is determined to be at a high level. Conversely, if the address signal potential is lower than reference potential VREF, the address signal potential is determined to be at a low level. If the address signal potential is high, the data of the flip-flop is inverted.

Figure 4:
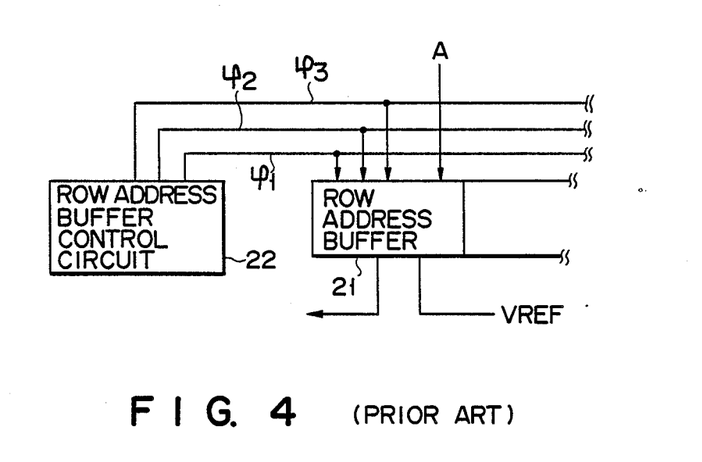
FIG. 4 shows a block diagram of the row address buffer of FIG. 2.

FIG. 4 shows a block diagram illustrating the FIG. 2 row address buffer and the row address buffer control circuit. As shown in FIG. 4, three control signal lines are necessary for introducing control signals $\phi 1$, $\phi 2$ and $\phi 3$ from row address buffer control circuit 22 to row address buffer 21.

In the prior semiconductor device shown in FIG. 1, 2n row address signal lines are formed on the semiconductor chip for n row address signals. On the semiconductor chip, the distance between the the address signal buffer and the row decoder is large, so that the wiring occupies a large area on the semiconductor chip. Reduction of the wiring area narrows the width of wiring and the intervals among the wirings. This makes it difficult to manufacture the semiconductor device.

The semiconductor devices shown in FIGS. 2 and 4 need each three control lines. For this reason, as in the semiconductor device shown in FIG. 1, the wiring area on the chip is large. Reduction of the wiring area narrows the width of wirings and the intervals between the wirings. This makes it difficult to fabricate the semiconductor device.

In the future, the capacity of the semiconductor devices will be increased, and the single semiconductor device thus operate in a multi-function manner. With this trend, the number of address signal lines and the control signal lines will also be increased. This necessitates a further reduction of the wiring width and the inter-wire interval, providing a more difficult technical problem in fabricating the semiconductor devices.

SUMMARY OF THE INVENTION

In view of the above problem, it is an object of this invention to provide a semiconductor device whose wiring occupying area on the semiconductor chip is reduced, thus solving the above-mentioned technical problem.

To achieve the above object, there is provided a semiconductor device comprising at least two digital signal lines for transferring a digital signal, an analog voltage generator connected to the output terminal of the two digital signal lines, and for converting the transferred digital signal into an analog signal, at least one analog signal line connected at the input terminal to the analog voltage generator, and for transferring the analog signal, a digital voltage generator connected to the output terminal of the one analog signal line, and for converting the transferred analog signal into a digital signal.

According to this invention, a digital signal is converted to an analog signal by the analog voltage generator. The analog signal is transferred via at least one analog signal line, to a digital voltage generator in which the analog signal transferred via the analog signal line is converted into a digital signal. In this way, the digital signal is converted into an analog signal at the input section of the semiconductor device, the converted analog signal is transferred to the digital signal generator through an analog signal line, and is converted back to a digital signal. Therefore, the number of wirings of the signal lines can be decreased, and hence the wiring occupying area on the semiconductor chip can be reduced.

DETAILED DESCRIPTION OF THE PREFERRED EMBODIMENTS

Some specific embodiments of this invention will now be described, by referring to the accompanying drawings.

Figure 5:
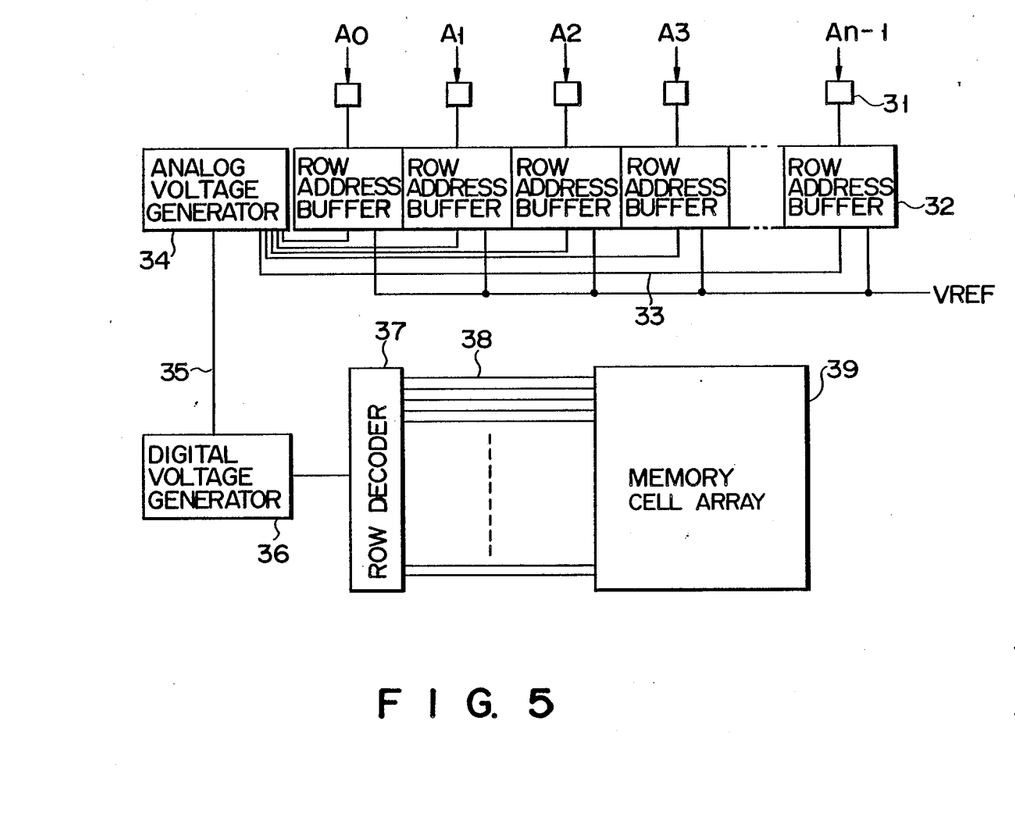
FIG. 5 shows a block diagram of a semiconductor device, particularly its row address designating section, according to this invention.

FIG. 5 shows a first embodiment of a semiconductor device according to this invention, particularly, a row address buffer, a row address decoder and a memory of a row address designation section. N row address signals of A0 to An-1 (n: an integer) are respectively input to n address pads 31. N address pads 31 are respectively connected to n row address buffers 32. Row address buffers 32 respectively receive the address signals input to address pads 31. Reference potential VREF is applied to row address buffers 32 via a reference potential line. Row address buffers 32 each output a high-level signal if the potential of the input row address signal is higher than reference potential VREF, and output a low-level signal, if the potential of the input row address signal is lower than reference potential VREF. Row address buffers 32 are connected to analog voltage generator 34 via respective digital row address signal lines 33. Analog voltage generator 34 is made up of a digital-analog converter. The output address signals of row address buffers 32 are input via respective address signal lines 33 to analog voltage generator 34, where they are converted into analog signals. Analog voltage generator 34 is connected to digital voltage generator 36 made up of an analog-digital converter, via one analog row address signal line 35. The address signal as analog converted by analog voltage generator 34 is input to analog voltage generator 36 via one address signal line 35. There, the address signal is converted into a digital signal. The address signal as converted into a digital signal by digital voltage generator 36 is input to row decoder 37. Row decoder 37 decodes the digital signal input from digital voltage generator 36. Row decoder 37 then selects and energizes one word line 38 as designated by the decoded digital signal, from a plurality of word lines 38 of memory cell array 39 that are connected to the output terminals of row address decoder 37.

As seen from the foregoing description, in this embodiment, only one row address signal line is necessary in order to introduce n row address signals from the address buffer to the row input address decoder, which are spaced relatively far apart on the semiconductor chip, while in the prior semiconductor device of FIG. 1, 2n row address signal lines are necessary. Therefore, the wiring occupying area on the chip can be reduced.

Figure 7:
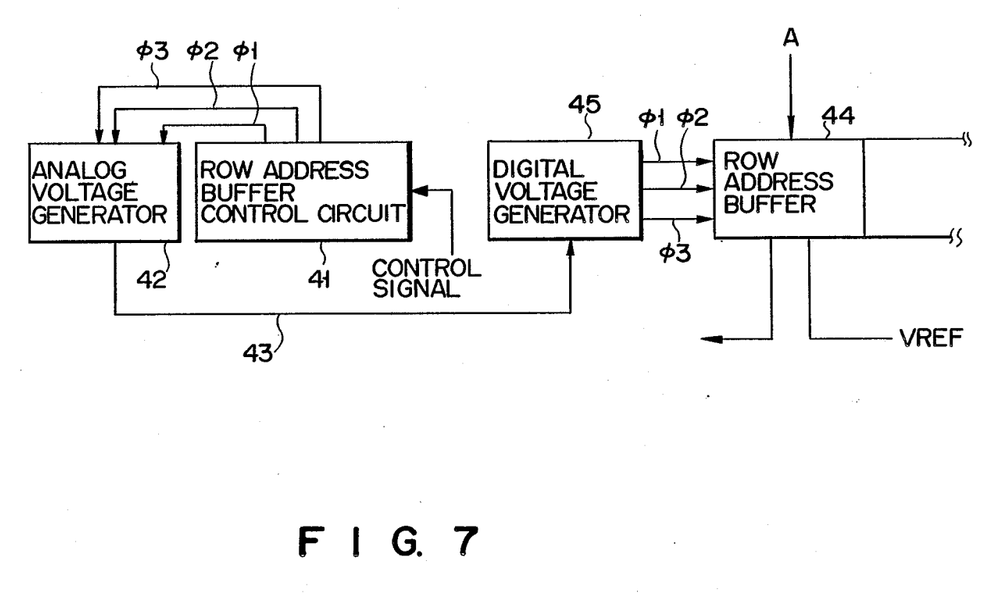
FIG. 7 shows a block diagram of a semiconductor device, particularly its row address designating section, according to yet another embodiment of this invention.

FIG. 7 shows a block diagram of the row address designation section of a second embodiment according to this invention.

Row address buffer 44 has the following functions: (a) comparison of the potential of the input address signal with reference potential VREF, (b) disconnection of row address buffer 44 from the address signal lines, and (c) check of potential levels of the input address signal and reference potential VREF.

Row address buffer control circuit 41 sequentially outputs control signals $\phi1$, $\phi2$ and $\phi3$, in response to the command from the system controller (not shown), to thereby control the potential of the output signal of analog voltage generator 42. Specifically, in response to a fetch request of input address signal from the system controller, row address buffer control circuit 41 sequentially outputs control signals $\phi1$, $\phi2$ and $\phi3$. Control signals $\phi1$, $\phi2$ and $\phi3$ are input to analog voltage generator 42 via respective control signal lines, to thereby control the potential of the output signal of analog voltage generator 42, i.e., the potential of analog control signal line 43. Specifically, the potential of the output signal of analog voltage generator 42, i.e., the potential of analog control signal line 43 is changed stepwise, according to control signals $\phi1$, $\phi2$ and $\phi3$. The output signal of analog voltage generator 42 is input to digital voltage generator 45 made up of analog-digital converter, via analog control signal line 43. There, the output signal is converted into digital control signals $\phi1$, $\phi2$, and $\phi3$. Output control signals $\phi1$, $\phi2$ and $\phi3$ of digital voltage generator 45 are input to row address buffer control circuit 41, to control the row address buffer 44.

The output potential of analog voltage generator 42 is set between 0 V to 0.5 V when the control signal is not supplied from row address buffer control circuit 41. This state is a stationary state, in which the state of row address buffer does not change.

When the total request of an input address signal is input from the system controller to row address buffer control circuit 41, row address buffer control circuit 41 sequentially outputs control signals $\phi1$, $\phi2$ and $\phi3$, to control the potential of the output signal of analog voltage generator 42. In this way, the potential of the analog control signal line 43, that is, the output signal line for analog voltage generator 42 is changed stepwise. More specifically, control signal line 43 is set to between 0.5 V to 1.5 V if control signal $\phi1$ is output from row address buffer control circuit 41. Control signal line 43 is set to between 1.5 V to 2.5 V if control signal 100 2 is output from address buffer control circuit 41. It is set to between 2.5 V to 3.0 V if control signal $\phi3$ is output from row address buffer control circuit 41. When signal $\phi1$ is output from row address buffer control circuit 41, and control signal line 43 is set between 0.5 V to 1.5 V, digital voltage generator 45 outputs control signal $\phi1$. Control signal $\phi1$ is input to address buffer 44. Under this condition, address buffer 44 executes the function (a), that is, the comparison of the input address signal potential with reference potential VREF. When signal $\phi2$ is output from row address buffer control circuit 41, and control signal line 43 is set between 1.5 V to 2.5 V, digital voltage generator 45 outputs control signal $\phi2$. Control signal $\phi2$ is input to row address buffer 44. Under this condition, address buffer 44 executes the function (b), that is, the disconnection of row address buffer 44 from the address signal signal line. When signal $\phi3$ is output from row address buffer control circuit 41, and control signal line 43 is set between 2.5 V to 3.0 V, digital voltage generator 45 outputs control signal $\phi3$. Control signal $\phi3$ is input to address buffer 44. Under this condition, address buffer 44 executes the function (c), that is, the potential level check of input address signal and the reference potential VREF.

In the embodiment of FIG. 7, the output control signals from the address buffer control circuit can be introduced by only a single line to the address buffer which is disposed on the semiconductor chip relatively far from the address buffer control circuit.

Therefore, the area on the semiconductor chip occupied by the wirings is reduced.

In the above-mentioned embodiments, this invention is applied to the address designation section of the semiconductor device. This invention is not limited to the above-mentioned embodiments, but can be applied for various types of circuits in which a plurality of digital signals are transferred and received.

Figure 6:
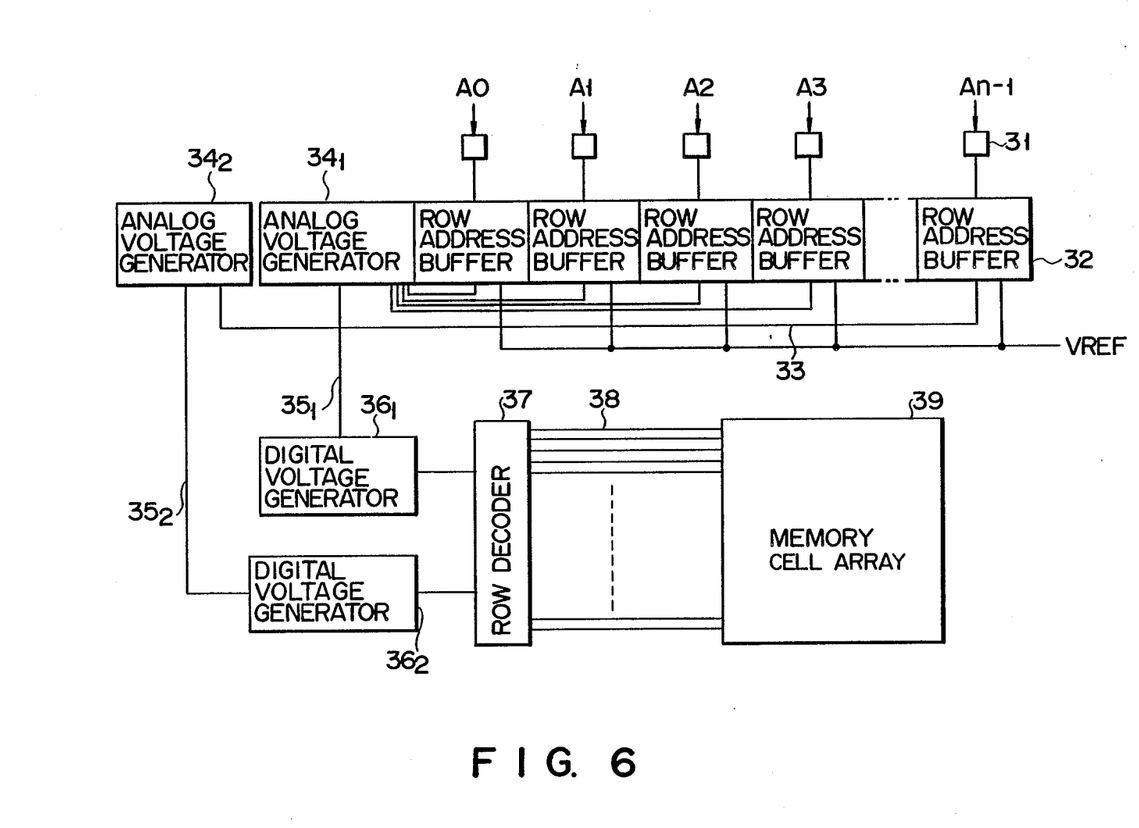
FIG. 6 shows a block diagram of a semiconductor device, particularly its row address designating section, according to another embodiment of this invention.
Figure 8:
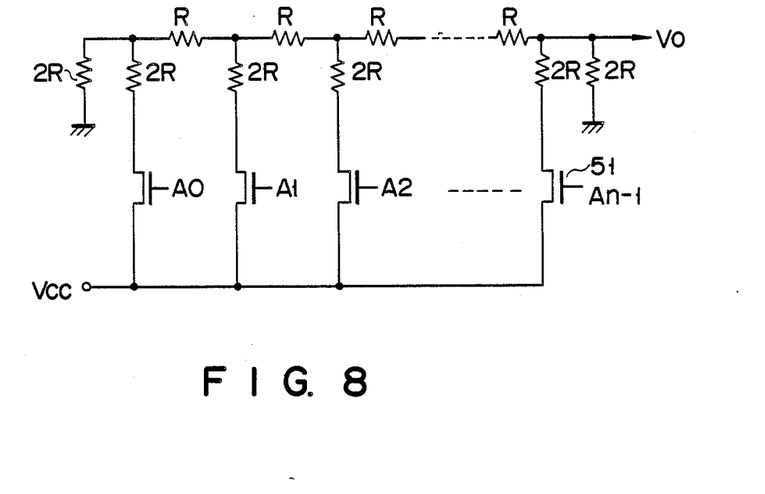
FIG. 8 shows a circuit diagram illustrating a detailed circuit of an example of an analog voltage generator used in the semiconductor circuit of FIG. 5 or 6, particularly illustrating the analog voltage generator which is a digital-analog converter including a ladder resistor circuit.

FIG. 8 shows a circuit diagram illustrating a specific circuit of the analog voltage generator of the semiconductor device of FIGS. 5 and 6.

This analog voltage generator is a digital-analog converter made up of a ladder resistor circuit of resistors R and resistors 2R with a resistance twice that of resistors R. A plurality of resistors R are connected in series between the output terminal for taking out analog output voltage Vo, and the ground potential. The first ends of resistors 2R are respectively connected at the connection points of resistors R, and at both ends of the series circuit of the resistors. The second ends of resistors 2R connected at both ends of the series circuit of resistors are grounded. The second ends of resistors 2R connected to the connection points of resistors R are connected to the power potential Vcc, respectively, via N channel enhancement type MOS transistors 51. Address input signals A0, A1, . . . An-1 are respectively input to N channel enhancement type MOS transistors 51. An N channel MOS transistor 51 that is supplied with a high-level address signal is turned on. Then, power potential Vcc is applied to resistor 2R connected to the turned-on transistor 51 via the turned on transistor 51. Analog output voltage Vo given by the following expression is obtained at the output terminal.

$$Vo=(Vcc/3)\times(A0\times2^0+A1\times2^{-1}+\ldots +An-1\times2^{-n+1})$$

The construction of the FIG. 8 circuit is simple, since only two types of resistors R and 2R are required, and, hence, is suited for fabrication inside the memory.

Figure 9:
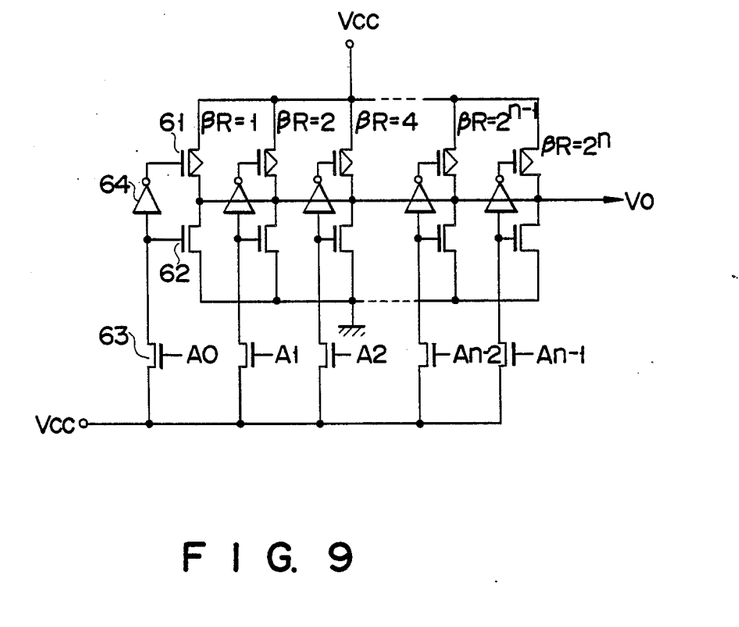
FIG. 9 shows a circuit diagram illustrating a detailed circuit of an analog voltage generator used in the semiconductor device of FIG. 5 or 6, particularly illustrating the analog voltage generator which is a digital-analog converter including a resistor-dividing type circuit using on-resistance of complementary MOS inverters.

FIG. 9 shows a circuit diagram illustrating another specific circuit of the analog voltage generator of the semiconductor device of FIGS. 5 and 6.

This analog voltage generator is made up of a digital-analog converter which is made up of a resistance dividing circuit by the on-resistance of the complementary MOS inverter.

A plurality of complementary MOS inverters are connected in parallel, each of which is made up of P channel enhancement type MOS (metal oxide semiconductor) transistor 61 and N channel enhancement type MOS transistor 62, which are connected in series between power potential Vcc and the ground potential. Power potential Vcc is supplied to the gates of N channel MOS transistors 62 of the MOS inverters, via respective N channel MOS transistors 63. Power potential Vcc is supplied to the gates of P channel MOS transistors 62 of the MOS inverter, via respective N channel MOS transistors 63 and inverters 64. Address signals A0 to An-1 are respectively input to the gates of N channel MOS transistors 63. The connection points of P channel MOS transistors 61 and N channel MOS transistors 62 of the plurality of complementary MOS inverters serve as the circuit output terminal for outputting output voltage Vo.

It is assumed that the channel length and the channel width of P channel MOS transistor 61 of the MOS inverter are respectively Lp and Wp, and the channel length of the channel width of N channel MOS transistor 62 are respectively Ln and Wr, and that $\beta p = Wp/Lp$, $\beta n = Wn/Ln$, $\beta R = \beta p/\beta n = (Wp/Lp)/(Wn/Ln)$. $\beta$Rs of the complementary MOS inverters are set to values one different from another by the second power. With such an arrangement, the output voltage Vo corresponding to the input address is derived from the circuit output terminal.

The FIG. 9 circuit can swing output voltage Vo from 0 V to power potential Vcc, and offers a good linearity.

Figure 10:
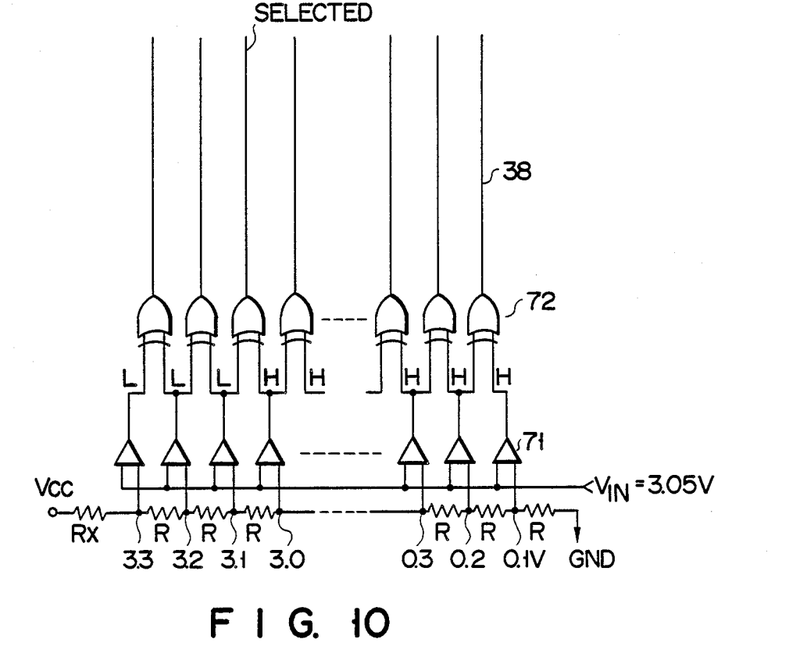
FIG. 10 is a circuit diagram illustrating a detailed circuit of an example of the digital voltage generator used in the semiconductor device of FIG. 5 or 6.

FIG. 10 shows a circuit configuration of a specific circuit of the digital voltage generator of the semiconductor device of FIGS. 5 and 6.

Power potential Vcc is voltage divided by the series resistor circuit of resistors R which are connected in series between the ground potential and power potential Vcc, and a plurality of reference potentials are generated. This series resistor circuit is connected to current limiting resistor Rx. These reference potentials are set at 0.1 V, 0.2 v, . . ., 3.3 V in 0.1 V steps. Input analog signal potential Vin is at 3.05 V. A plurality of comparators 71 are respectively provided for reference potentials, each for comparing the reference potential and analog signal potential Vin. If analog signal potential Vin is higher than the reference potential, comparator 71 outputs a high-level (H level) signal. Conversely, if analog signal potential Vin is lower than the reference potential, comparator 71 outputs a low level (L level) signal. A plurality of exclusive OR circuits 72 are provided, for making the exclusive logical sum of the output signals of two adjacent comparators 71. Of the plurality of exclusive OR circuits 72, the OR circuit whose first and second input signals are respectively at a high and a low level, outputs a high level signal. Then one corresponding word line 38 is selected from among the plurality of word lines 38.

Figure 11:
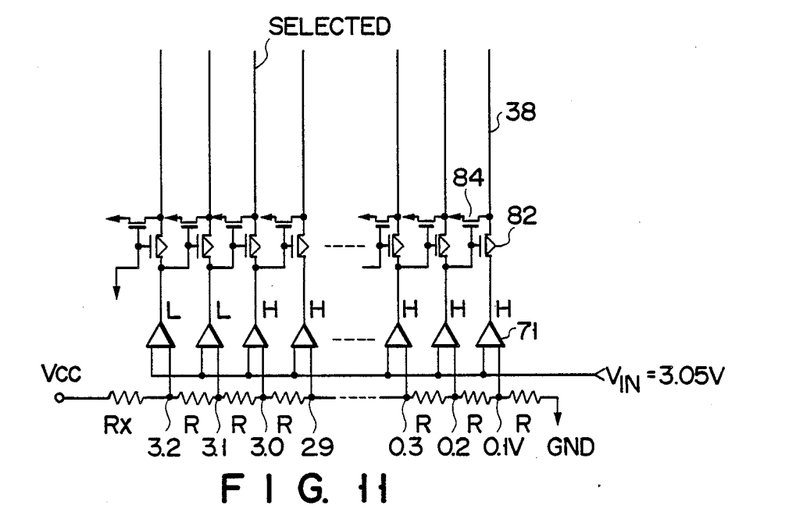
FIG. 11 is a circuit diagram illustrating a detailed circuit of another example of the digital voltage generator used in the semiconductor circuit of FIG. 5 or 6.

FIG. 11 shows a circuit configuration of a specific circuit of the digital voltage generator of the semiconductor device of FIGS. 5 and 6.

In this circuit, instead of a plurality of exclusive OR circuits 72, MOS transistor circuits (complementary MOS inverters) made up of P channel enhancement type MOS transistors 82 and N channel enhancement type MOS transistors 84 are used. The circuit configuration is substantially the same as that of FIG. 10, except for the above point. Therefore, like reference symbols are used for designating like portions and parts in FIGS. 10 and 11.

Power potential Vcc is voltage divided by the series resistor circuit of resistors R which are connected in series between the ground potential and power potential Vcc, and a plurality of reference potentials are generated. This series resistor circuit is connected to current limiting resistor Rx. These reference potentials are set at 0.1 V, 0.2 V, . . ., 3.3 V in 0.1 V steps. Input analog signal potential Vin is at 3.05 V. A plurality of comparators 71 are respectively provided for reference potentials, each for comparing the reference potential and analog signal potential Vin. If analog signal potential Vin is higher than the reference potential, comparator 71 outputs a high-level (H level) signal. Conversely, if analog signal potential Vin is lower than the reference potential, comparator 71 outputs a low level (L level) signal. A plurality of MOS transistor circuits (complementary MOS inverters) are provided, for making the exclusive logical sum of the output signals of two adjacent comparators 71. The plurality of MOS transistor circuits are each made up of P channel MOS transistor 82 and N channel MOS transistor 84. P channel MOS transistor 82 of each MOS transistor circuit is connected between the output terminal of its associated comparator 71 and word line 38. N channel MOS transistor 84 of each MOS transistor is connected between word line 38 and the ground potential. The gates of P channel MOS transistor 82 and N channel MOS transistor 84 are both connected to the output terminal of the adjacent comparator 71 whose reference potential is one reference potential higher than that of the comparator now coupled with the current paths of these transistors. To select one word line 38 from the plurality of word lines 38, of those MOS transistor circuits, the following specific one outputs a high (H) level signal. Such transistor circuit receives a high level signal from its associated comparator 71, and a low (L) level signal from the adjacent comparator 71. More specifically, in this specific transistor circuit, a high level signal is input to the source of P channel MOS transistor 82, and a low level signal is input to the gates of P channel MOS transistor 82 and N channel MOS transistor 84.

In the FIG. 11 circuit, exclusive OR circuits 72 of the FIG. 10 circuit are replaced by MOS transistor circuits, which are each made up of two MOS transistors (P channel MOS transistor 82 and N channel MOS transistor 84). This makes chip area of the circuit small.

As described above, in the semiconductor circuit of this invention, a digital signal is converted into an analog signal by the input section, and the analog signal is transferred by the analog signal line. Therefore, the number of wirings for transferring between the circuit which are distanced far apart on the semiconductor chip can be decreased and the area of the wirings on the chip can also be decreased.

What is claimed is:

1. A semiconductor memory device, comprising:
   a buffer for receiving and outputting a first digital signal;
   a digital-to-analog converter for receiving said first digital signal output from said buffer, converting the first digital signal into an analog signal, and outputting the analog signal;
   an analog-to-digital converter for receiving said analog signal output from said digital-to-analog converter, converting the analog signal into a second digital signal, and outputting the second digital signal;
   a decoder for receiving said second digital signal output from said analog-to-digital converter, and decoding the second digital signal;
   at least two digital signal lines for transferring said first digital signal output from said buffer to said digital-to-analog converter; and
   at least one analog signal line for transferring said analog signal output from said digital-to-analog converter to said analog-to-digital converter.

2. The semiconductor device according to claim 1, wherein said first and second digital signals are address signals, and said at least one analog signal line includes an address signal line.

3. The semiconductor device according to claim 1, wherein said first and second digital signals are control signals, and said at least one analog signal line includes a control signal line.

4. The semiconductor device according to claim 1, wherein said digital-to-analog converter includes a ladder resistor circuit.

5. The semiconductor device of claim 1, wherein said digital-to-analog converter includes resistance dividing circuits using the on-resistances of the complementary MOS inverter.

6. The semiconductor device according to claim 1, wherein said analog-to-digital converter includes a series-resistor circuit for generating a plurality of reference potentials by resistor division, a plurality of comparators respectively for comparing the plurality of reference potentials with said analog signal transferred by said at least one analog signal line, and a plurality of exclusive OR circuits, each for making the exclusive logical sum of the outputs of the two adjacent comparators.

7. The semiconductor device according to claim 1, wherein said analog-to-digital converter includes a series-resistor circuit for generating a plurality of reference potentials by resistor division, a plurality of comparators respectively for comparing the plurality of reference potentials with said analog signal transferred by said at least one analog signal line, and a plurality of transistor circuits respectively for receiving the output signals of two adjacent ones of said comparators, and outputting a signal when the levels of the output signals are the same.

8. The semiconductor device according to claim 4, wherein said digital-to-analog converter includes a plurality of first resistors which are connected in series, a plurality of second resistors of a resistance twice that of said first resistors, the first ends of said second resistors being respectively connected to the connection points of said plurality of first resistors, and a plurality of transistors respectively connected between the second ends of said second resistors and the power potential, the gates of said plurality of transistors being respectively supplied with said digital signals.

9. The semiconductor device according to claim 5, wherein said digital-to-analog converter includes a plurality of complementary MOS inverters which are connected in parallel, each being made up of a P channel MOS transistor and N channel MOS transistor which are connected in series between the respective power potentials and the reference potential, the connection points of said P channel MOS transistor and N channel MOS transistor serving as the circuit output terminals, and a plurality of MOS transistors, the first terminals of which are connected to the power potential, and the second terminals of which are directly connected to the gates of one of the MOS transistor groups of P and N channels, and also to the gates of the other transistor group, and said digital signal being input to these gates.

10. The semiconductor device according to claim 9, wherein, when the channel length and the channel width of said P channel MOS transistor of the MOS inverter are respectively Lp and Wp, and the channel length and the channel width of said N channel MOS transistor are respectively Ln and Wn, and that $\beta p = Wp/Lp$, $\beta n = Wn/Ln$, $\beta R = \beta p/\beta n = (Wp/Lp)/(Wn/Ln)$, $\beta$Rs of the complementary MOS inverters are set to values different from one another by the [2n-th] $2^{nth}$ power.

* * * * *

UNITED STATES PATENT AND TRADEMARK OFFICE
CERTIFICATE OF CORRECTION

PATENT NO. : 4,929,945
DATED : May 29, 1990
INVENTOR(S) : Natsuki Kushiyama

It is certified that error appears in the above-identified patent and that said Letters Patent is hereby corrected as shown below:

Claim 10, line 33, and column 10, delete "[2n-th]".

Signed and Sealed this

Twenty-fourth Day of November, 1992

Attest:

DOUGLAS B. COMER

*Attesting Officer*     *Acting Commissioner of Patents and Trademarks*